US010483189B2

(12) United States Patent
Uneme et al.

(10) Patent No.: US 10,483,189 B2
(45) Date of Patent: Nov. 19, 2019

(54) POWER CONVERSION APPARATUS

(71) Applicant: HONDA MOTOR CO., LTD., Minato-ku, Tokyo (JP)

(72) Inventors: Takahiro Uneme, Wako (JP); Yuko Yamada, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 16/151,365

(22) Filed: Oct. 4, 2018

(65) Prior Publication Data

US 2019/0109068 A1 Apr. 11, 2019

(30) Foreign Application Priority Data

Oct. 10, 2017 (JP) .................. 2017-197046

(51) Int. Cl.
| H05K 7/20 | (2006.01) |
| H01L 23/40 | (2006.01) |
| H01L 23/473 | (2006.01) |
| H05K 7/14 | (2006.01) |
| B60L 53/20 | (2019.01) |
| H01L 23/433 | (2006.01) |

(52) U.S. Cl.
CPC .......... H01L 23/4012 (2013.01); B60L 53/20 (2019.02); H01L 23/4334 (2013.01); H01L 23/473 (2013.01); H05K 7/1432 (2013.01); H05K 7/20927 (2013.01)

(58) Field of Classification Search
None
See application file for complete search history.

(56) References Cited

U.S. PATENT DOCUMENTS

| 2004/0232534 A1* | 11/2004 | Seki ......................... C25D 5/02 257/678 |
| 2006/0096299 A1* | 5/2006 | Mamitsu ................ H01L 23/473 62/3.2 |
| 2010/0083495 A1* | 4/2010 | Hirayama .............. H05K 1/187 29/839 |

(Continued)

FOREIGN PATENT DOCUMENTS

| JP | 2006-278467 | 10/2006 |
| JP | 2010-258315 | 11/2010 |
| JP | 2015-149883 | 8/2015 |

OTHER PUBLICATIONS

Japanese Office Action for Japanese Patent Application No. 2017-197046 dated Jun. 11, 2019.

*Primary Examiner* — Courtney L Smith
(74) *Attorney, Agent, or Firm* — Amin, Turocy & Watson LLP

(57) ABSTRACT

A power conversion apparatus mounted in a vehicle includes a semiconductor stack in which a plurality of semiconductor modules and a plurality of coolants including coolant passages are disposed by being alternately stacked, and a retaining unit which presses the semiconductor stack in a stacking direction to retain the semiconductor stack. The semiconductor modules and the coolants are attached to each other by a plate-shaped insulating resin adhesive member, and a roughened area on which a roughening treatment has been performed is formed in at least a part of the outer surface of the coolants to which the resin adhesive member is attached.

12 Claims, 3 Drawing Sheets

(56) References Cited

U.S. PATENT DOCUMENTS

| | | | |
|---|---|---|---|
| 2011/0194246 A1* | 8/2011 | Nakasaka | H05K 7/20927 |
| | | | 361/688 |
| 2014/0345843 A1* | 11/2014 | Kirkor | F28F 23/00 |
| | | | 165/185 |
| 2016/0190033 A1* | 6/2016 | Morozumi | H01L 24/34 |
| | | | 257/712 |
| 2016/0322275 A1* | 11/2016 | Yamada | H01L 23/3114 |
| 2017/0040241 A1* | 2/2017 | Yoshida | H01L 23/40 |
| 2017/0117208 A1* | 4/2017 | Kasztelan | H01L 23/4952 |

* cited by examiner

POWER CONVERSION APPARATUS

CROSS-REFERENCE TO RELATED APPLICATION

Priority is claimed on Japanese Patent Application No. 2017-197046, filed Oct. 10, 2017, the content of which is incorporated herein by reference.

BACKGROUND OF THE INVENTION

Field of the Invention

The present invention relates to a power conversion apparatus.

Description of Related Art

Recently, vehicles equipped with a rotational electrical machine (motor) for driving vehicles, such as fuel-cell vehicles, hybrid vehicles and electric vehicles, have been developed.

Such vehicles are equipped with a power conversion apparatus including a semiconductor stack having a plurality of semiconductor modules and a plurality of coolants including a coolant passage which are disposed by being alternately stacked, as disclosed in Japanese Unexamined Patent Application, First Publication No. 2006-278467, for example.

In the semiconductor stack in the power conversion apparatus, the plurality of semiconductor modules and the plurality of coolants are pressed in a stacking direction using a retaining member such as a flat spring, for example. Accordingly, positional deviation of the semiconductor modules and the coolants in an orthogonal direction perpendicular to the stacking direction are prevented.

SUMMARY OF THE INVENTION

However, in the above-described conventional power conversion apparatus, it is necessary to increase the size of the retaining member to secure a pressing force in the stacking direction in order to securely prevent positional deviation of the semiconductor modules and the coolants in the orthogonal direction in the semiconductor stack. Therefore, there is room for improvement in accomplishment of a compact power conversion apparatus.

An object of embodiments of the present invention devised in view of the aforementioned circumstances is to provide a power conversion apparatus capable of preventing an increase in the size of a retaining member which retains a semiconductor stack to realize a compact configuration.

To accomplish the object to solve the aforementioned problem, the present invention employs the following aspects.

(1) A power conversion apparatus according to one aspect of the present invention is a power conversion apparatus mounted in a vehicle, which includes: a semiconductor stack in which a plurality of semiconductor modules and a plurality of coolants including coolant passages are disposed by being alternately stacked; and a retaining unit which presses the semiconductor stack in a stacking direction to retain the semiconductor stack, wherein the semiconductor modules and the coolants are attached to each other by a plate-shaped insulating resin adhesive member, and a roughened area on which a roughening treatment has been performed is formed in at least a part of an outer surface of the coolants to which the resin adhesive member is attached.

(2) In the aspect (1), a surface roughness of the roughened area may be less than a thickness of the resin adhesive member.

(3) In the aspect (1) or (2), a metal plate may be disposed at ends of the semiconductor modules in the stacking direction, and the resin adhesive member may cover an entire metal plate.

(4) In the aspect (3), the roughened area and a non-roughened area on which a roughening treatment has not been performed may be formed on a surface facing the semiconductor modules in the outer surface of the coolants, and the roughened area may extend to an outer side of the metal plate in the semiconductor modules in a sectional view in the stacking direction.

(5) In any one of the aspects (1) to (3), the roughened area may be formed on an entire outer surface of the coolants.

(6) In any one of the aspects (1) to (5), the plate-shaped resin adhesive member may be formed by adding a filler having a higher thermal conductivity than that of a base material resin to the base material resin.

According to the aspect (1), the semiconductor modules and the coolants which are disposed by being alternately stacked in the stacking direction are attached to each other by the resin adhesive member. Accordingly, it is possible to improve adhesive strength in the stacking direction of the semiconductor module and the coolant and an orthogonal direction perpendicular to the stacking direction.

In addition, a roughening treatment is performed on the part to which the resin adhesive member is attached in the outer surface of the coolant. Accordingly, the coefficient of friction in the orthogonal direction on the outer surface of the coolant can be improved and thus a pressing force in the stacking direction necessary to retain the semiconductor stack can be reduced.

Accordingly, it is possible to prevent an increase in the size of a retaining member which retains the semiconductor stack to realize a compact configuration.

According to the aspect (2), the surface roughness of the roughening treatment is less than the thickness of the resin adhesive member. Thus, the resin adhesive member attached to the roughened area is not buried in the roughened area. Accordingly, it is possible to prevent the adhesive strength due to the resin adhesive member from decreasing by securing a contact area between the resin adhesive member and the semiconductor module.

According to the aspect (3), since the resin adhesive member covers the entire metal plate, the adhesive strength of the semiconductor modules and the coolant can be effectively improved.

Further, a roughening treatment is performed on the outer surface of the coolant. Thus, a large contact area between the outer surface of the coolant and the resin adhesive member can be secured and thus heat radiation from the metal plate to the coolant through the resin adhesive member is easily performed. Accordingly, it is possible to prevent an increase in the thermal resistance between the semiconductor module and the coolant to effectively cool the semiconductor module.

According to the aspect (4), the roughened area and the non-roughened area are formed on the surface facing the semiconductor module in the outer surface of the coolant, and thus the boundary region between the roughened area and the non-roughened area can be easily visually recognized. Accordingly, it is possible to easily determine the positions of the semiconductor module and the coolant in the orthogonal direction during manufacture by using the boundary region as a mark for position recognition by a manufacturing facility and as a base for position alignment when the semiconductor module and the coolant are attached.

Further, since the roughened area extends to the outer side of a copper plate, it is possible to use the boundary region as a base for position alignment without the boundary region being hidden by the copper plate.

According to the aspect (5), since the roughened area is formed on the entire outer surface of the coolant, a part of the external surface of the coolant need not be masked when a roughening treatment is performed.

Accordingly, it is possible to secure manufacturability of the coolant to prevent increase in processing costs.

According to the aspect (6), the resin adhesive member 60 is formed by adding a filler having a higher thermal conductivity than that of a base material resin to the base material resin. Accordingly, it is possible to prevent an increase in the thermal resistance between the semiconductor module and the coolant while securing the adhesive strength between the semiconductor module and the coolant using the resin adhesive member.

DETAILED DESCRIPTION OF THE INVENTION

Figure 1:
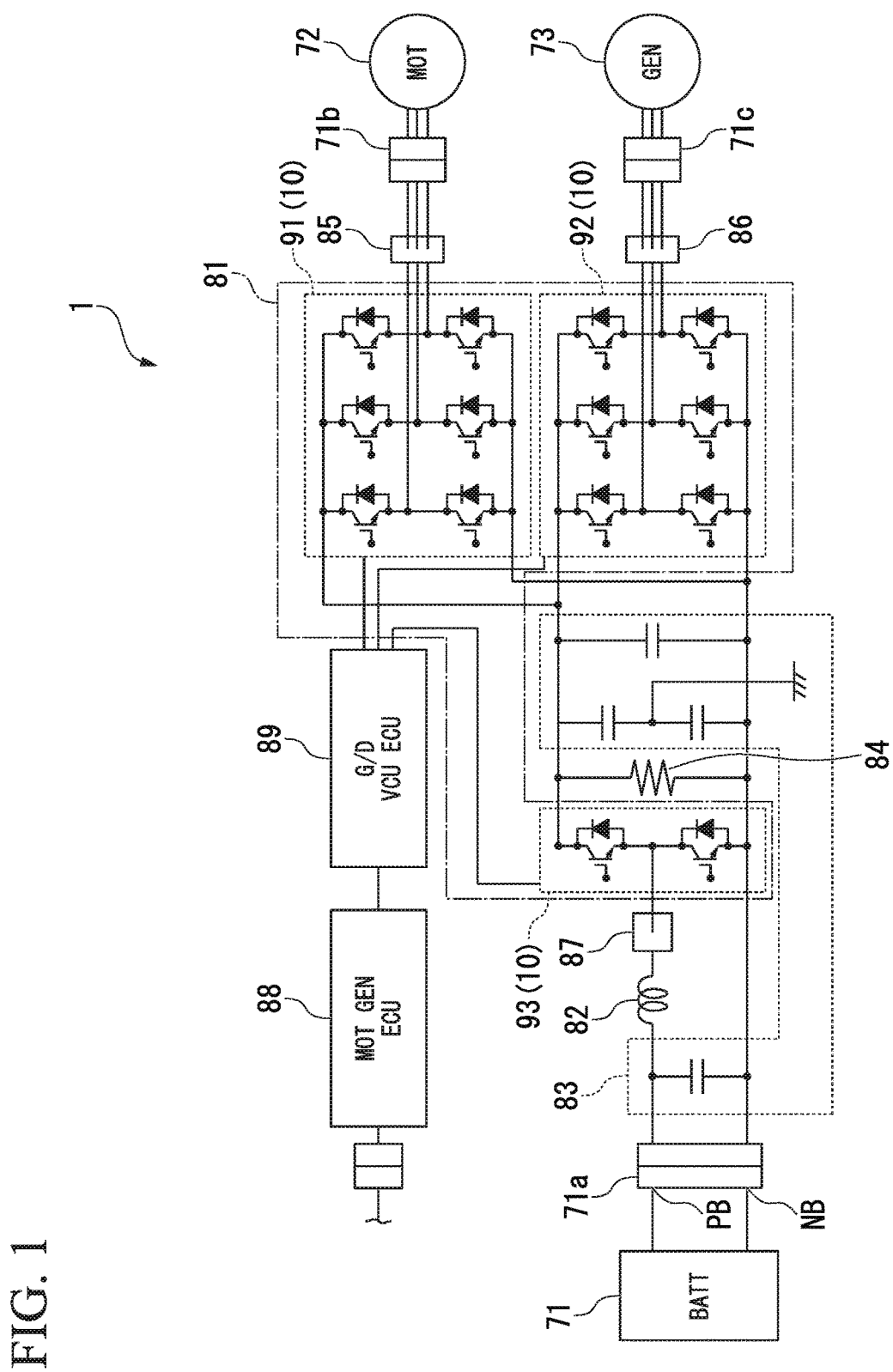
FIG. 1 is a diagram showing a configuration of a part of a vehicle equipped with a power conversion apparatus according to a first embodiment of the present invention.

Hereinafter, a power conversion apparatus 1 according to a first embodiment of the present invention will be described on the basis of FIGS. 1 to 4. FIG. 1 is a diagram showing a configuration of a part of a vehicle equipped with the power conversion apparatus 1 according to the first embodiment of the present invention.

The power conversion apparatus 1 according to the present embodiment is mounted in a motor compartment (not shown) of the vehicle.

The power conversion apparatus 1 according to the present embodiment controls power transfer between a motor and a battery.

For example, the power conversion apparatus 1 is mounted in a vehicle such as an electrically driven vehicle. The electrically driven vehicle includes an electric car, a hybrid vehicle, a fuel-cell vehicle and the like. The electric car is driven using a battery as a driving source. The hybrid vehicle is driven using a battery and an internal combustion engine as a driving source. The fuel-cell vehicle is driven using a fuel cell as a driving source.

As shown in FIG. 1, the vehicle includes a battery 71, a first motor 72 for driving running and a second motor 73 for electricity generation in addition to the power conversion apparatus 1.

The battery 71 includes a positive terminal PB and a negative terminal NB connected to a DC connector 71a of the power conversion apparatus 1.

The first motor 72 generates a rotation driving force using power supplied from the battery 71. The second motor 73 generates regenerative electric power using a rotation driving force input to a rotation shaft. For example, each of the first motor 72 and the second motor 73 may be a 3-phase AC brushless DC motor.

Each of the first motor 72 and the second motor 73 is an inner rotor type and includes a rotor having a permanent magnet for a magnetic field and a stator having a 3-phase stator winding for generating a rotary magnetic field which rotates the rotor. The 3-phase stator winding of the first motor 72 is connected to a first 3-phase connector 71b of the power conversion apparatus 1. The 3-phase stator winding of the second motor 73 is connected to a second 3-phase connector 71c of the power conversion apparatus 1.

The power conversion apparatus 1 includes a power module 81, a reactor 82, a condenser unit 83, a resistor 84, a first current sensor 85, a second current sensor 86, a third current sensor 87, an electronic control unit 88, and a gate drive unit 89.

The power module 81 includes semiconductor modules 10 constituting a power conversion circuit which transfers power with respect to the first motor 72 and the second motor 73. The power module 81 includes a first power conversion circuit unit 91, a second power conversion circuit unit 92 and a third power conversion circuit unit 93 as the semiconductor modules 10 composed of semiconductor elements.

The first power conversion circuit unit 91 is connected to the 3-phase state winding of the first motor 72 by the first 3-phase connector 71b. The first power conversion circuit unit 91 converts DC power input from the battery 71 through the third power conversion circuit unit 93 into 3-phase AC power. The second power conversion circuit unit 92 is connected to the 3-phase state winding of the second motor 73 by the second 3-phase connector 71c. The second power conversion circuit unit 92 converts 3-phase AC power input from the second motor 73 into DC power.

Figure 2:
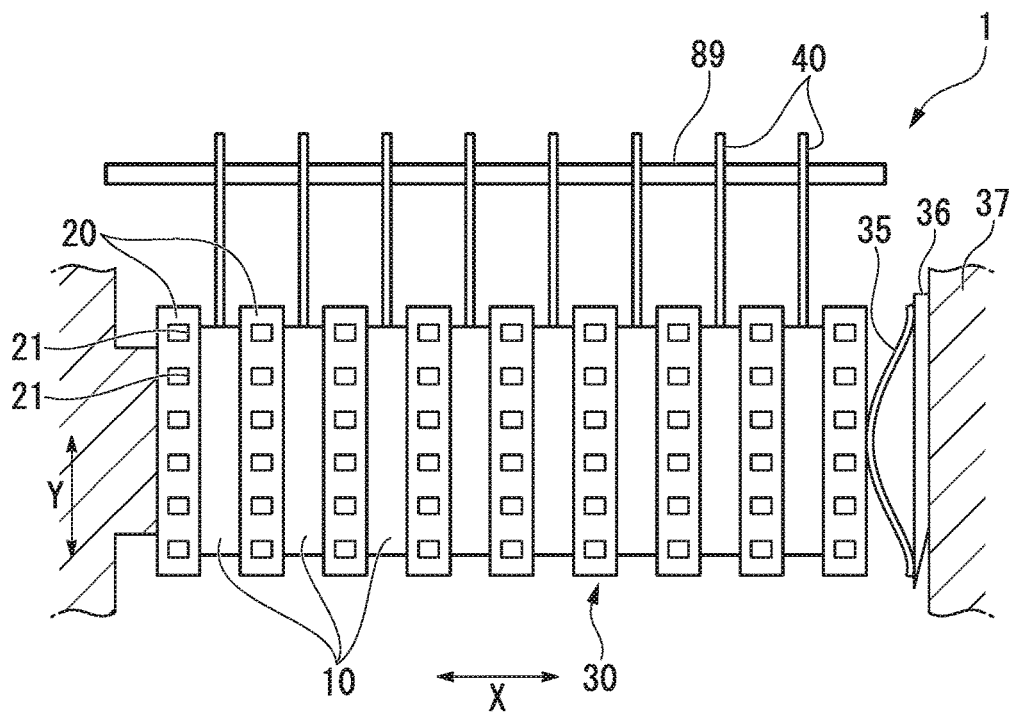
FIG. 2 is a cross-sectional view showing a part of the power conversion apparatus according to the first embodiment of the present invention.

FIG. 2 is a cross-sectional view showing a part of the power conversion apparatus 1 according to the first embodiment of the present invention. The power conversion apparatus 1 includes a semiconductor stack 30 having a plurality of semiconductor modules 10 and a plurality of coolants 20 including coolant passages 21 which are disposed by being alternately stacked, and a retaining unit 35 which presses the semiconductor stack 30 to retain the semiconductor stack 30.

In the following description, a direction in which the semiconductor modules 10 and the coolants 20 are disposed by being alternately stacked in the semiconductor stack 30 is referred to as a stacking direction X and a direction perpendicular to the stacking direction X is referred to as an orthogonal direction Y.

Signals lines 40 are respectively connected to the semiconductor modules 10. Each signal line 40 extends in one direction in the orthogonal direction Y and is connected to each terminal of the gate drive unit 89. The gate drive unit 89 extends in the stacking direction X.

In the present embodiment, a flat spring is employed as the retaining unit 35. A wedge member 36 is inserted between the retaining unit 35 and a case 37 such that the retaining unit 35 presses the semiconductor stack 30 in the stacking direction X to retain the semiconductor stack 30.

Figure 3:
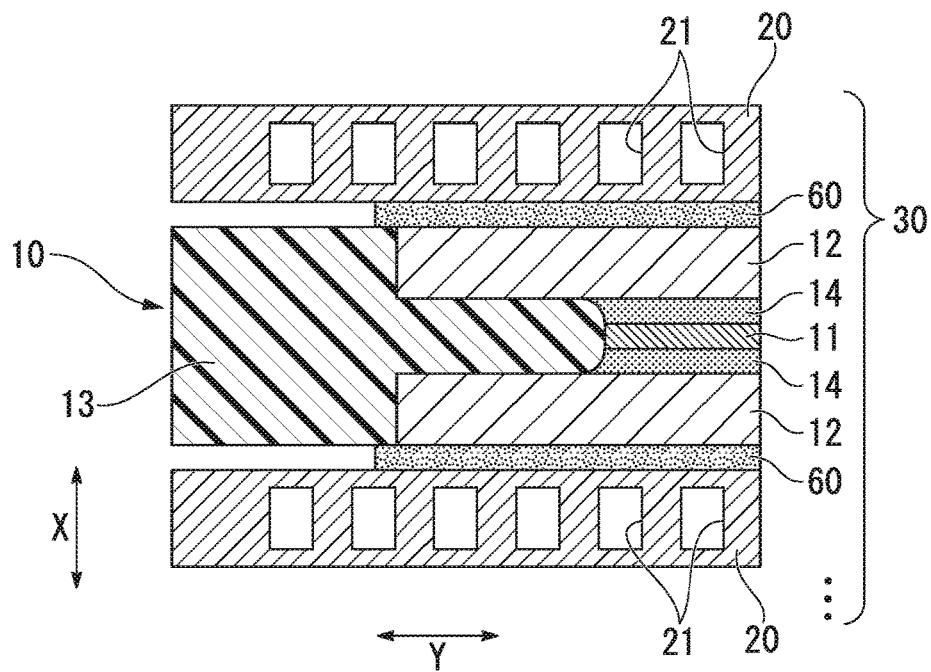
FIG. 3 is an enlarged cross-sectional view of a semiconductor stack in the power conversion apparatus shown in FIG. 2.

FIG. 3 is an enlarged cross-sectional view of the semiconductor stack 30 in the power conversion apparatus 1 shown in FIG. 2.

The semiconductor module 10 includes an electronic chip 11 disposed in the central part in the stacking direction X, a copper plate (metal plates) 12 enclosing the electronic chip 11 from both sides in the stacking direction X, and a mold 13 integrally retains the electronic chip 11 and the copper plate 12. The copper plate 12 and the electronic chip 11 are connected to each other by a conductive adhesive 14. For example, solder may be employed as the conductive adhesive 14.

The copper plate 12 has a rectangular shape when viewed in the stacking direction X. The copper plate 12 is disposed at both ends of the semiconductor module 10 in the stacking direction X. Specifically, the copper plate 12 is composed of an insulating layer as a central layer and a copper pattern (conductive pattern) enclosing the insulating layer from both sides in the stacking direction X.

The mold 13 is formed of a synthetic resin, for example.

The coolants 20 have a rectangular shape when viewed in the stacking direction X. For example, the coolants 20 are formed of a metal material such as aluminum, for example.

The coolant passages 21 are formed inside the coolants 20. In the coolant passages 21, a plurality of passages extending in a direction perpendicular to the aforementioned one direction in the orthogonal direction communicate with each other to form one passage. A coolant such as water passes through the coolant passages 21 and thus can remove heat of the semiconductor modules 10 from the external surfaces of the coolants 20.

Figure 4:
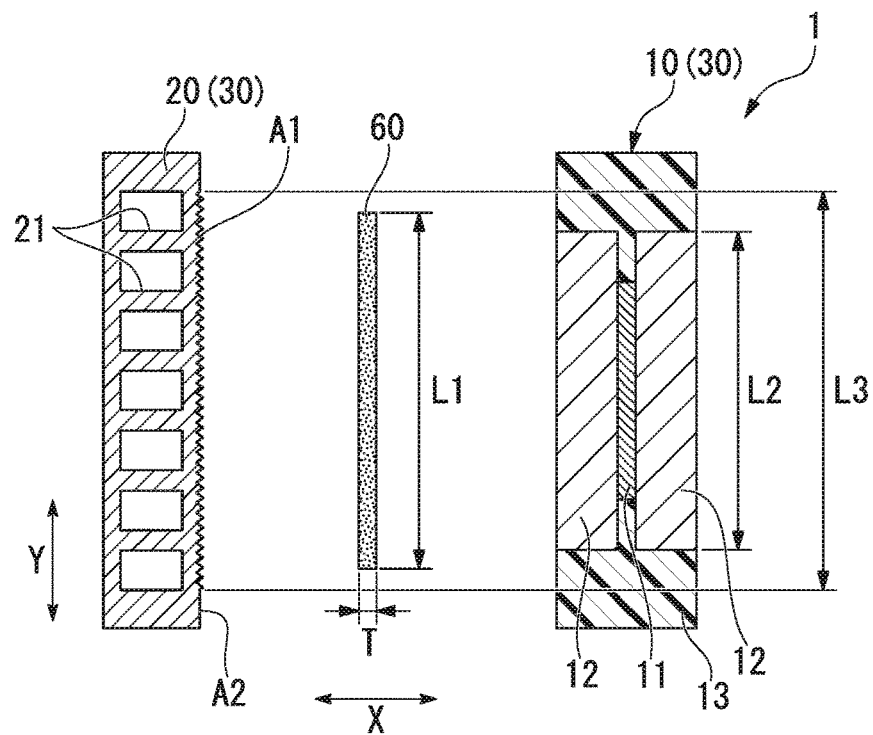
FIG. 4 is a schematic cross-sectional view roughly showing a state before stacking of the semiconductor stack shown in FIG. 3.

FIG. 4 is a schematic diagram roughly showing a state before stacking of the semiconductor stack 30 shown in FIG. 3.

In the present embodiment, the semiconductor module 10 and the coolant 20 are attached to each other by an insulating plate-shaped resin adhesive member 60, as shown in FIGS. 3 and 4.

The resin adhesive member 60 has a rectangular shape when viewed in the stacking direction X. The thickness T of the resin adhesive member 60 in the stacking direction X is uniform throughout the resin adhesive member 60. The resin adhesive member 60 covers the entire copper plate 12. Accordingly, the size L1 of the resin adhesive member 60 in the orthogonal direction Y is greater than the size L2 of the copper plate 12 in the orthogonal direction Y.

In addition, in the present embodiment, a roughened area A1 on which a roughening treatment has been performed is formed in at least a part of the external surface of the coolant 20 to which the resin adhesive member 60 is attached.

The surface roughness of the roughened area A1 is coarser than the surface roughness of other areas (e.g., a non-roughened area A2 and normal processed surfaces such as inner surfaces of the coolant passages 21 in the coolant 20) on which a roughening treatment has not been performed in the external surface of the coolant 20. The surface roughness of the roughened area A1 is less than the thickness T of the resin adhesive member 60. This will be described in detail below.

When the arithmetic mean roughness of the roughened area A1 of the coolant 20 is Ra ($\mu$m) and the thickness of the resin adhesive member 60 is T ($\mu$m), the roughened area A1 and the resin adhesive member 60 are formed to satisfy the equation, Ra<T . . . (1).

Further, the present invention is not limited to such an embodiment and the roughened area A1 and the resin adhesive member 60 may be formed to satisfy the equation, Rz<T . . . (2) when a maximum height of the roughened area A1 of the coolant 20 is Rz ($\mu$m).

In addition, in the present embodiment, the roughened area A1 and the non-roughened area A2 on which a roughening treatment has not been performed are formed on a surface facing the semiconductor module 10 in the external surface of the coolant 20. The roughened area A1 extends to the outer side of the copper plate 12 in the semiconductor module 10 in a sectional view in the stacking direction X. That is, the size L3 of the roughened area A1 in the orthogonal direction Y is greater than the size L2 of the copper plate 12 in the orthogonal direction Y.

Further, the resin adhesive member 60 is formed by adding a filler having a higher thermal conductivity than that of a base material resin to the matrix resin in the present embodiment. The resin adhesive member 60 is formed by adding the aforementioned filler (additive) to a base material formed of an insulating resin material, kneading and mixing the base material and the filler and then forming the mixed material into a plate shape. As such a resin material, for example, epoxy resin, imide resin, polyphenylene ether (PPE), bismaleimide triazine (BT resin), fluorocarbon resin, silicone resin, phenol resin or the like may be used.

A simple substance or a composite such as aluminum nitride (AlN), silicon nitride ($Si_3N_4$) or alumina ($Al_2O_3$) may be employed as a filler. As other materials, for example, a single substance or a mixture such as barium titanate ($BaTiO_3$) or strontium titanate ($SrTiO_3$) may be employed.

In this manner, the semiconductor modules 10 and the coolants 20 which are alternatively stacked in the stacking direction X are attached to each other by the resin adhesive member 60 in the power conversion apparatus 1 according to the present embodiment. Accordingly, it is possible to improve adhesive strength of the semiconductor modules 10 and the coolants 20 in the stacking direction X and the orthogonal direction Y perpendicular to the stacking direction X.

In addition, a roughening treatment is performed on the part to which the resin adhesive member 60 is attached in the outer surface of the coolant 20. Accordingly, the coefficient of friction in the orthogonal direction Y on the outer surface of the coolant 20 can be improved and thus a pressing force in the stacking direction X necessary to retain the semiconductor stack 30 in the stacking direction X can be reduced.

Accordingly, it is possible to prevent an increase in the size of the retaining unit 35 which retains the semiconductor stack 30 in the stacking direction X to realize a compact configuration.

Furthermore, the surface roughness of the roughened area A1 is less than the thickness of the resin adhesive member 60. Thus, the resin adhesive member 60 attached to the roughened area A1 is not buried in the roughened area A1. Accordingly, it is possible to prevent the adhesive strength due to the resin adhesive member 60 from decreasing by securing a contact area of the resin adhesive member 60 and the semiconductor module 10.

Moreover, since the resin adhesive member 60 covers the entire metal plate, the adhesive strength of the semiconductor module 10 and the coolant 20 can be effectively improved.

Further, a roughening treatment is performed on the outer surface of the coolant 20. Thus, a large contact area between the outer surface of the coolant 20 and the resin adhesive member 60 can be secured and thus heat radiation from the metal plate to the coolant 20 through the resin adhesive member 60 is easily performed. Accordingly, it is possible to prevent an increase in the thermal resistance between the semiconductor module 10 and the coolant 20 to effectively cool the semiconductor module 10.

In addition, the roughened area A1 and the non-roughened area A2 are formed on the surface facing the semiconductor module 10 in the outer surface of the coolant 20. Thus, the boundary region between the roughened area A1 and the non-roughened area A2 can be easily visually recognized. Accordingly, it is possible to easily determine the positions of the semiconductor module 10 and the coolant 20 in the orthogonal direction Y during manufacture by using the boundary region as a mark for position recognition by a manufacturing facility and as a base for position alignment when the semiconductor module 10 and the coolant 20 are attached.

Further, since the roughened area A1 extends to the outer side of the copper plate 12, it is possible to use the boundary region as a base for position alignment without the boundary region being hidden by the copper plate 12.

Moreover, the resin adhesive member 60 is formed by adding a filler having a higher thermal conductivity than that of a base material resin to the base material resin. Accordingly, it is possible to prevent an increase in the thermal resistance between the semiconductor module 10 and the coolant 20 while securing the adhesive strength between the semiconductor module 10 and the coolant 20 by the resin adhesive member 60.

Second Embodiment

Figure 5:
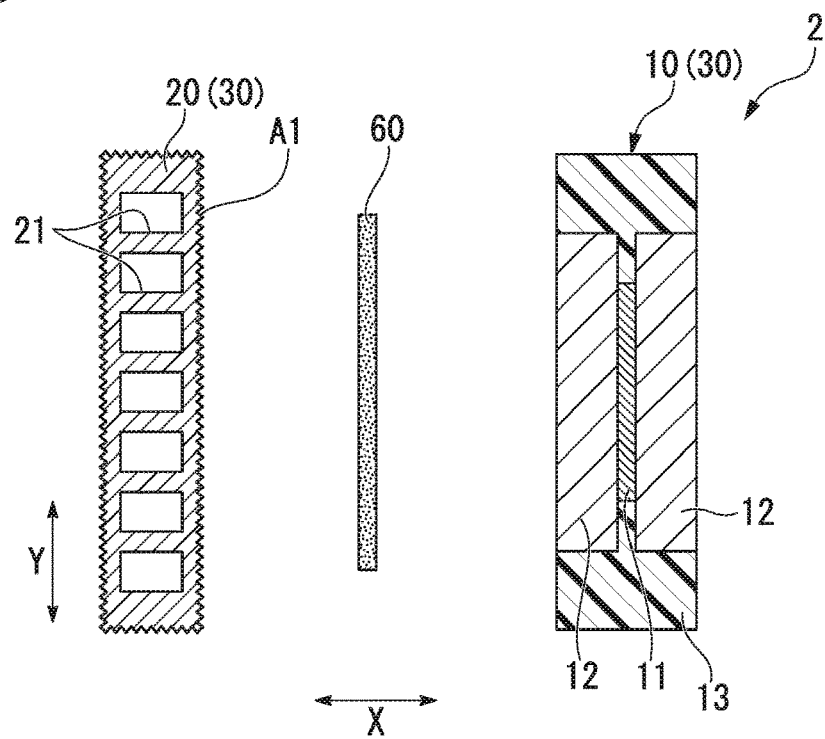
FIG. 5 is a schematic cross-sectional view showing a simplified state before stacking of a semiconductor stack in a power conversion apparatus according to a second embodiment of the present invention.

Hereinafter, a power conversion apparatus 2 according to a second embodiment of the present invention will be described on the basis of FIG. 5. Meanwhile, description of the same components and functions as those in the first embodiment will be omitted in the following description. FIG. 5 is a schematic diagram roughly showing a state before stacking of the semiconductor stack 30 in the power conversion apparatus 2 according to the second embodiment of the present invention.

In the power conversion apparatus 2 according to the present embodiment, the roughened area A1 is formed on the entire outer surface of the coolant 20, as shown in FIG. 5. Accordingly, the non-roughened area A2 is not formed on the outer surface of the coolant 20.

In this manner, the roughened area A1 is formed on the entire outer surface of the coolant 20 in the power conversion apparatus 2 according to the present embodiment, and thus a part of the external surface of the coolant 20 need not be masked when a roughening treatment is performed. Accordingly, it is possible to secure manufacturability of the coolant 20 to prevent increase in processing costs.

Meanwhile, the present invention is not limited to the above embodiments described with reference to the drawings and various modified examples may be conceived within the technical scope of the present invention.

For example, although a configuration in which the surface roughness of a part on which a roughening treatment has been performed in the external surface of the coolant 20 is less than the thickness T of the resin adhesive member 60 has been represented in each of the aforementioned embodiments, the present invention is not limited thereto. The surface roughness of the part on which a roughening treatment has been performed may be greater than the thickness T of the resin adhesive member 60.

In addition, although a configuration in which the resin adhesive member 60 covers the entire metal plate in the semiconductor module 10 has been represented in each of the above-described embodiments, the present invention is not limited thereto. The resin adhesive member 60 may partially cover the metal plate.

Further, although a configuration in which the roughened area A1 on the outer surface of the coolant 20 extends to the outer side of the metal plate in the semiconductor module 10 in the section view in the stacking direction X has been represented in each of the above-described embodiments, the present invention is not limited thereto. The roughened area A1 may not extend to the outer side of the metal plate in the semiconductor module 10 in the section view.

Moreover, although a configuration in which the resin adhesive member 60 is formed by adding a filler having a higher thermal conductivity than that of a base material resin to the base material resin has been represented in each of the above-described embodiments, the present invention is not limited thereto. The filler may have lower thermal conductivity than the base material resin and the resin adhesive member 60 may not include the filler.

Furthermore, although a configuration in which the power conversion apparatuses 1 and 2 are mounted in a motor room of a vehicle has been represented in each of the above-described embodiments, the present invention is not limited thereto. The power conversion apparatuses 1 and 2 may be mounted in a rear part of a vehicle or the like as an independent 2-motor driving circuit unit for rear wheel drive such as electric 4WD, for example.

In addition, the components in the above-described embodiments may be replaced by known components without departing from the spirit or scope of the present invention.

What is claimed is:

1. A power conversion apparatus mounted in a vehicle, comprising:
   a semiconductor stack in which a plurality of semiconductor modules and a plurality of coolant bodies are disposed by being alternately stacked, wherein the plurality of coolant bodies includes coolant passages; and
   a retaining unit which presses the semiconductor stack in a stacking direction to retain the semiconductor stack,
   wherein the plurality of semiconductor modules and the plurality of coolant bodies are attached to each other by a resin adhesive member, and a roughened area on which a roughening treatment has been performed is formed in at least a part of an outer surface of the plurality of coolant bodies to which the resin adhesive member is attached, and wherein the roughened area is formed on an entire outer surface of the plurality of coolant bodies.

2. The power conversion apparatus according to claim 1, wherein a surface roughness of the roughened area is less than a thickness of the resin adhesive member.

3. The power conversion apparatus according to claim 1, wherein a first metal plate is disposed at a first end of the plurality of semiconductor modules and a second metal plate is disposed at a second end of the plurality of semiconductor modules in the stacking direction, and the resin adhesive member covers a first surface of the first metal plate and a second surface of the second metal plate.

4. The power conversion apparatus according to claim 3, wherein the roughened area and a non-roughened area on which the roughening treatment has not been performed are formed on a surface facing the plurality of semiconductor modules in the outer surface of the plurality of coolant bodies, and the roughened area extends to an outer side of the first metal plate and the second metal plate in the plurality of semiconductor modules in a sectional view in the stacking direction.

5. The power conversion apparatus according to claim 1, wherein the resin adhesive member is formed by adding a filler having a higher thermal conductivity than that of a base material resin to the base material resin.

6. The power conversion apparatus according to claim 1, wherein the resin adhesive member is a plate-shaped insulating resin adhesive member.

7. A power conversion apparatus mounted in a vehicle, comprising:
 a semiconductor stack in which a plurality of semiconductor modules and a plurality of coolant bodies are disposed by being alternately stacked, wherein the plurality of coolant bodies includes coolant passages; and
 a retaining unit which presses the semiconductor stack in a stacking direction to retain the semiconductor stack,
 wherein the plurality of semiconductor modules and the plurality of coolant bodies are attached to each other by a resin adhesive member, and a roughened area on which a roughening treatment has been performed is formed in at least a part of an outer surface of the plurality of coolant bodies to which the resin adhesive member is attached, and wherein the roughened area and a non-roughened area on which the roughening treatment has not been performed are formed on a surface facing the plurality of semiconductor modules in the outer surface of the plurality of coolant bodies, and the roughened area extends to an outer side of a first metal plate and a second metal plate in the plurality of semiconductor modules in a sectional view in the stacking direction.

8. The power conversion apparatus according to claim 7, wherein a surface roughness of the roughened area is less than a thickness of the resin adhesive member.

9. The power conversion apparatus according to claim 7, wherein the first metal plate is disposed at a first end of the plurality of semiconductor modules and the second metal plate is disposed at a second end of the plurality of semiconductor modules in the stacking direction, and the resin adhesive member covers a first surface of the first metal plate and a second surface of the second metal plate.

10. The power conversion apparatus according to claim 7, wherein the roughened area is formed on an entire outer surface of the plurality of coolant bodies.

11. The power conversion apparatus according to claim 7, wherein the resin adhesive member is formed by adding a filler having a higher thermal conductivity than that of a base material resin to the base material resin.

12. The power conversion apparatus according to claim 7, wherein the resin adhesive member is a plate-shaped insulating resin adhesive member.

* * * * *